(12) United States Patent
Fujii et al.

(10) Patent No.: US 8,726,475 B2
(45) Date of Patent: May 20, 2014

(54) METHOD FOR PRODUCING PIEZOELECTRIC THIN-FILM RESONATOR

(75) Inventors: Hidetoshi Fujii, Ishikawa-gun (JP); Ryuichi Kubo, Ishikawa-gun (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 1076 days.

(21) Appl. No.: 12/203,412

(22) Filed: Sep. 3, 2008

(65) Prior Publication Data

US 2009/0000091 A1 Jan. 1, 2009

Related U.S. Application Data

(62) Division of application No. 11/270,259, filed on Nov. 10, 2005, now Pat. No. 7,436,102.

(30) Foreign Application Priority Data

Nov. 10, 2004 (JP) .................. 2004-326975
Oct. 31, 2005 (JP) .................. 2005-316894

(51) Int. Cl.
*H03H 3/02* (2006.01)
*H03H 3/08* (2006.01)

(52) U.S. Cl.
USPC .......... 29/25.35; 29/846; 204/192.32; 216/67

(58) Field of Classification Search
USPC ......... 29/25.35, 594, 846; 310/311, 324, 320, 310/334; 204/192.32, 192.35, 192.36; 257/668; 522/90; 216/67; 552/90
See application file for complete search history.

(56) References Cited

U.S. PATENT DOCUMENTS

| 4,604,168 | A | * | 8/1986 | Liu et al. ............... 204/192.36 X |
| 5,705,443 | A | * | 1/1998 | Stauf et al. ........... 204/192.35 X |
| 5,986,335 | A | * | 11/1999 | Amagai ........................ 257/668 |
| 6,017,973 | A | * | 1/2000 | Tamura et al. ............... 522/90 X |
| 6,406,589 | B1 | * | 6/2002 | Yanagisawa ................ 216/67 X |
| 2003/0102773 | A1 | * | 6/2003 | Ylilammi et al. ............. 310/311 |

FOREIGN PATENT DOCUMENTS

JP 06050870 A * 2/1994

OTHER PUBLICATIONS

Fujii et al.; "Piezoelectric Thin-Film Resonator and Method for Producing the Same"; U.S. Appl. No. 11/270,259, filed Nov. 10, 2005.

* cited by examiner

*Primary Examiner* — A. Dexter Tugbang
(74) *Attorney, Agent, or Firm* — Keating & Bennett, LLP

(57) ABSTRACT

A method for producing a piezoelectric thin-film resonator includes forming a sacrificial layer on a substrate, performing a plasma treatment on the sacrificial layer so that the surface roughness (Ra) of end surface portions of the sacrificial layer is about 5 nm or less, forming a strip-shaped dielectric film so as to be continuously disposed on the surface of the substrate and the end surface portions and the principal surface of the sacrificial layer, forming a piezoelectric thin-film area including a lower electrode, an upper electrode, and a piezoelectric thin-film disposed therebetween so that a portion of the lower electrode and a portion of the upper electrode surface each other at an area on the dielectric film, the area being disposed on the upper portion of the sacrificial layer, and removing the sacrificial layer to form an air-gap between the substrate and the dielectric film.

9 Claims, 2 Drawing Sheets

METHOD FOR PRODUCING PIEZOELECTRIC THIN-FILM RESONATOR

BACKGROUND OF THE INVENTION

1. Field of the Invention

The present invention relates to a piezoelectric thin-film resonator and a method for producing the same.

2. Description of the Related Art

In piezoelectric thin-film resonators, a vibrating portion in which a piezoelectric thin-film is disposed between a pair of excitation electrodes facing each other must be acoustically separated from a substrate. For this purpose, the vibrating portion (membrane) must be partially lifted from the substrate with an air-gap layer therebetween.

In a piezoelectric thin-film resonator having this type of structure, a vibrating portion includes a supporting portion supported on a substrate and a lifting portion lifted from the substrate. The lifting portion is supported by the supporting portion, and thus a stress is easily concentrated in the vicinity of the boundary between the lifting portion and the supporting portion.

Japanese Examined Patent Application Publication No. 6-40611 discloses a piezoelectric thin-film resonator having such a structure. The piezoelectric thin-film resonator described here is often used as a terminal part for mobile communication or a part for BLUETOOTH™ communication devices. In recent years, devices themselves have been significantly reduced in size because the communication frequency has become higher. The frequency is determined by the following equation: Resonant frequency=frequency constant of the piezoelectric diaphragm/T, wherein T represents the thickness of the vibrating portion.

The frequency constant of the piezoelectric diaphragm is a constant determined by the piezoelectric material. For example, when a piezoelectric thin-film resonator is used in the 2 GHz band, the thickness of a piezoelectric film is about 2 µm, the thickness of each electrode is about 0.1 µm, and the thickness of an air-gap layer is about 1 µm.

As described above, the thickness of the air-gap layer has become very small and thus it is known that the finish of the electrodes provided on this air-gap layer having a small thickness significantly affects the characteristics of the piezoelectric thin-film resonator.

As described above, piezoelectric thin-film resonators have been significantly reduced in size as the communication frequency has become higher. Consequently, new problems, which have not been considered as important problems in the past, have arisen. The problems will be described below.

An air-gap layer is formed according to the following process. First, a sacrificial layer is formed on a substrate. A main portion of a piezoelectric thin-film resonator is formed on the surface of the sacrificial layer so as to be continuous with the surface of the substrate. Subsequently, the sacrificial layer is removed by etching or the like to form the air-gap layer.

When a crystalline material such as zinc oxide is used for the sacrificial layer, the smoothness of end surface portions of the sacrificial layer is generally deteriorated compared with the principal surface of the sacrificial layer. The surface roughness (Ra) of the end surface portions of the sacrificial layer is about 10 nm to about 20 nm. As described above, as the frequency becomes higher, the thickness of the sacrificial layer becomes very small. Consequently, the deterioration of the smoothness of the end surface portions causes the following problems:

1) The smoothness of a dielectric film provided on the sacrificial layer is also deteriorated. Furthermore, crystallinity of a lower electrode provided on the dielectric film is deteriorated, resulting in the increase in wiring resistance. Thereby, resonance characteristics are deteriorated.

2) It becomes difficult to cover the sacrificial layer with a thin dielectric film. On the other hand, when the thickness of the dielectric film increases in order to improve the covering ability, resonance characteristics are deteriorated.

3) If the covering by the dielectric film is insufficient, an area is formed where the sacrificial layer is in contact with the lower electrode. In such a case, when the sacrificial layer is removed, the lower electrode is corroded by an acid or the like used for removing the sacrificial layer. The corrosion of the electrode deteriorates resonance characteristics.

These problems become more obvious because as the communication frequency becomes higher, devices are reduced in size, and accordingly, the thickness of the air-gap layer becomes very small.

SUMMARY OF THE INVENTION

In order to overcome the problems described above, preferred embodiments of the present invention provide a piezoelectric thin-film resonator having improved resonance characteristics and electric power resistance.

A preferred embodiment of the present invention provides a method for producing a piezoelectric thin-film resonator including the steps of forming a sacrificial layer on a substrate, performing a plasma treatment on the sacrificial layer so that the surface roughness (Ra) of end surface portions of the sacrificial layer is about 5 nm or less, forming a strip-shaped dielectric film so as to be continuously disposed on the surface of the substrate and the end surface portions and the principal surface of the sacrificial layer, forming a piezoelectric thin-film area including a lower electrode, an upper electrode, and a piezoelectric thin-film disposed therebetween so that a portion of the lower electrode and a portion of the upper electrode face each other at an area on the dielectric film, the area being disposed on the upper portion of the sacrificial layer, and removing the sacrificial layer to form an air-gap between the substrate and the dielectric film.

According to a preferred embodiment of the method for producing a piezoelectric thin-film resonator of the present invention, the sacrificial layer may include a crystalline compound.

According to a preferred embodiment of the method for producing a piezoelectric thin-film resonator of the present invention, the sacrificial layer may include zinc oxide.

According to a preferred embodiment of the method for producing a piezoelectric thin-film resonator of the present invention, the sacrificial layer may include an organic polymer.

According to a preferred embodiment of the method for producing a piezoelectric thin-film resonator of the present invention, the sacrificial layer may include Ge, Sb, Ti, Al, or Cu.

According to a preferred embodiment of the method for producing a piezoelectric thin-film resonator of the present invention, the plasma treatment may be a method in which RF discharge is performed with an inert gas such as Ar or He and the sacrificial layer is sputter-etched by the self bias.

According to a preferred embodiment of the method for producing a piezoelectric thin-film resonator of the present invention, a gas containing an element provided in the sacrificial layer may be used as a gas for the plasma treatment.

According to a preferred embodiment of the method for producing a piezoelectric thin-film resonator of the present invention, an oxide may be used for the sacrificial layer and oxygen may be used as the gas for the plasma treatment.

A preferred embodiment of the present invention provides a piezoelectric thin-film resonator including a substrate on which a sacrificial layer is provided, a strip-shaped dielectric film that is continuously disposed on the surface of the substrate and end surface portions and the principal surface of the sacrificial layer, and a piezoelectric thin-film area including a lower electrode, an upper electrode, and a piezoelectric thin-film disposed therebetween wherein a portion of the lower electrode and a portion of the upper electrode face each other at an area on the dielectric film, the area being disposed on the upper portion of the sacrificial layer, and an air-gap between the substrate and the dielectric film, the air-gap being formed by removing the sacrificial layer. In the piezoelectric thin-film resonator, a plasma treatment is applied so that the surface roughness (Ra) of the end surface portions of the sacrificial layer is about 5 nm or less.

According to preferred embodiments of the present invention, since end surface portions of a sacrificial layer for forming an air-gap are planarized, the covering ability of a dielectric thin-film provided on the sacrificial layer can be improved. As a result, an electrode provided on the dielectric thin-film is not simultaneously etched during the etching of the sacrificial layer. Therefore, an electrode material that is corroded by a dilute acid can be used for the electrode, and thus the device itself can be inexpensively produced. In addition, since corrosion of the electrode by a dilute acid can be prevented, defects of the electrode are not generated. Thus, a satisfactory resonator can be produced.

As in the operation described above, corrosion of a piezoelectric material by the dilute acid can also be prevented, and thus a satisfactory resonator can be produced.

According to preferred embodiments of the present invention, since end surface portions of the sacrificial layer for forming the air-gap are planarized, the surface smoothness of the dielectric thin-film provided on the sacrificial layer can also be improved and crystallinity of the electrode provided on the dielectric thin-film can be improved. Consequently, the wiring resistance can be decreased to produce a satisfactory resonator. Similarly, a resonator having excellent electric power resistance can be produced.

According to preferred embodiments of the present invention, the planarization of end surface portions of the sacrificial layer for forming the air-gap can simultaneously planarize the principal surface of the sacrificial layer, resulting in the improvement of the orientation of a piezoelectric film. Thus, a resonator having satisfactory characteristics can be produced.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

A sacrificial layer for forming an air-gap layer is provided on a substrate. A dielectric film, a lower electrode, a piezoelectric film, and an upper electrode are provided on the sacrificial layer. Such a piezoelectric resonator is produced as follows.

FIGS. 1A to 1H are cross-sectional views showing the order of production of a piezoelectric thin-film resonator according to a preferred embodiment of the present invention. FIG. 2 shows a perspective view of a final drawing of the piezoelectric thin-film resonator according to a preferred embodiment of the present invention. A method for producing the piezoelectric thin-film resonator according to a preferred embodiment of the present invention will now be described step-by-step with reference to FIGS. 1A to 1H.

Figure 1A:
FIGS. 1A to 1H are views showing central cross-sections of a piezoelectric thin-film resonator according to a preferred embodiment of the present invention in the order of production.
Figure 2:
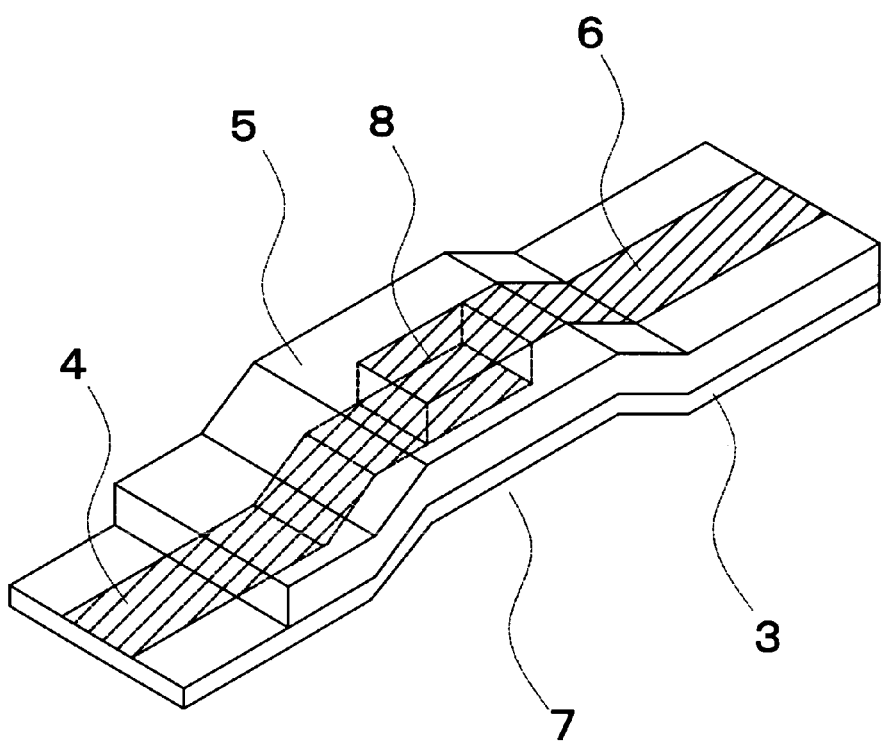
FIG. 2 is a perspective view of the piezoelectric thin-film resonator according to a preferred embodiment of the present invention in which a substrate disposed at the bottom is not shown.

FIG. 1A shows an example of a substrate 1 serving as a bottom layer of a piezoelectric resonator. A substrate that is inexpensive and that has excellent workability is used as the substrate 1. A silicon or glass substrate having a smooth surface is suitable for the substrate 1.

Figure 1B:

FIG. 1B shows an example of an intermediate product in which a sacrificial layer 2 is provided on the substrate 1. The sacrificial layer 2 for forming an air-gap layer 7 is provided on the substrate 1 by techniques such as sputtering and photo etching, for example. The material of the sacrificial layer 2 should withstand a high temperature which the intermediate product may reach when a piezoelectric thin-film 5 is formed, and should be easy to chemically remove. Typically, zinc oxide is suitable. Other examples of the material include metals such as Ge, Sb, Ti, Al, and Cu; phosphosilicate glass (PSG); and organic polymers. Preferred examples of the organic polymers include polytetrafluoroethylene and derivatives thereof, polyphenylene sulfide, polyether ether ketone, polyamides, polyamide-imides, polyimides, polyimide-siloxane, vinyl ethers, polyphenyl, parylene-n, parylene-f, and benzocyclobutene. With respect to the thickness of the sacrificial layer 2, it is necessary that when a membrane serving as a vibrating portion 8 is bent, the vibrating portion 8 is not in contact with the substrate 1. In view of ease of the formation, the thickness of the sacrificial layer 2 is preferably about 0.5 μm to about several micrometers. The minimum distance between end surface portions of the sacrificial layer 2 and the vibrating portion 8 is about 50 times the thickness of the vibrating portion 8 or less. Preferably, the end surface portions of the sacrificial layer 2 provide a substantially tapered shape and the angle formed between each of the end surface portions and the substrate is about 15 degrees so that a stress applied on bending portions of electrodes can be reduced.

Figure 1C:
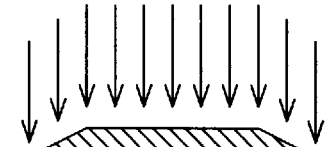

FIG. 1C shows a step of a plasma treatment of the sacrificial layer 2. The sacrificial layer 2 provided in the previous step is planarized by a plasma treatment. The plasma treatment may be either ion etching or plasma etching, for example. Ion etching includes the following processes: CCP-RIE (Reactive Ion Etch), Dual-frequency CCP-RIE, ECR Etch, Helicon-wave Plasma Etch, and Ion Milling. In the case of using ion for planarization, RF discharge is performed with an inert gas such as Ar or He, and sputter etching may be performed by the self bias. That is, when the substrate 1 is positioned over a ground electrode, DC electrode, or an AC electrode so that the substrate 1 will go through ion etching, an electric potential lower than the plasma is provided to the substrate 1. This electric potential attracts ions within the plasma to bring about the collision by ions with the substrate 1. Sputter etching includes etching an object by use of the physical energy due to this collision. According to sputter etching, an electric field is concentrated on protruded portions, that is, ions are concentrated on protruded portions so that physical collision energy is intensively provided on protruded portions and the sacrificial layer 2 can be effectively planarized. Even in sputter etching, when radicals reactive with the object are generated in the plasma, the following problems may occur. For example, the radicals react with the surface of the sacrificial layer to form a layer that is difficult to etch or, on the contrary, the sacrificial layer is etched. In this regard, however, the method of using plasma of an inert gas (rare gas) such as Ar or He is advantageous because such radicals are hardly generated. Otherwise, planarization can be achieved without using ions by positioning the substrate at float potential, which is so-called plasma etching, for example. In this case, no bias is applied on the substrate and collision of the ions on the substrate is difficult to occur. Therefore, in plasma etching, chemical reactions between neutral radicals in the plasma and the object are mainly utilized. In this case, however, the reaction proceeds while irregularities formed before planarization are maintained as they are. Therefore, the sacrificial layer is sometimes planarized less effectively than the case by sputter etching.

When the sacrificial layer 2 includes an oxide such as zinc oxide, gaseous oxygen may be used. In the case where the sacrificial layer includes ZnO, preferably the surface of the sacrificial layer is pure ZnO. The ZnO layer is finally removed by etching. In this final etching step, if the surface of the sacrificial layer is not in the pure state of ZnO, for example, if a layer including a compound containing another substance has been formed on the surface or if the bonding state of ZnO has been changed, the etching may not easily start or, in the worst case, etching may not be performed, resulting in the failure of formation of an air-gap. When only the inside of the sacrificial layer can be etched but the outermost layer thereof cannot be etched, even though the air-gap can be formed, the remaining outermost layer serves as a leak path or the like, resulting in deterioration of electrical properties of the device and a decrease in the ratio of non-defective products. However, when oxygen, which is an element of ZnO, is used as plasma, a compound containing an element other than ZnO, i.e., a compound that is difficult to etch, is not formed on the surface of the sacrificial layer. Accordingly, the plasma treatment does not destabilize the step of etching the sacrificial layer. In this way, in place of the above-described inert gas, the plasma treatment may be performed with a gas, such as gaseous oxygen, which is an element of the sacrificial layer. This can also prevent problems from occurring. The surface roughness (Ra) of the end surface portions of the sacrificial layer is preferably about 5 nm or less.

Figure 1D:

FIG. 1D shows an example of a dielectric film 3 that continuously covers the surface of the substrate 1 and the surface of the sacrificial layer 2. The dielectric film 3 is preferably formed by sputtering, chemical vapor deposition (CVD), electron beam evaporation, or the like so as to cover the entire surface of the sacrificial layer 2. A nitride such as aluminum nitride, which is an insulating material and has satisfactory thermal conductivity, or silicon nitride, which has excellent passivation property, is preferably used for the dielectric film 3. Furthermore, the material used for the dielectric film 3 preferably has frequency temperature characteristics opposite to those of the material used for the piezoelectric thin-film 5. In such a case, the change in frequency relative to the change in temperature of the resonator filter is reduced to improve the characteristics. When zinc oxide or aluminum nitride is used for the piezoelectric thin-film 5, silicon oxide, which has frequency temperature characteristics opposite to those of these materials, is preferably used.

Figure 1E:
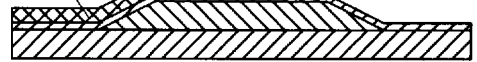

FIG. 1E shows an example of an intermediate product in which a lower electrode 4 is formed on the dielectric film 3 formed in the previous step. The lower electrode 4 is formed on the dielectric film 3 by a step of forming the film by sputtering, plating, CVD, electron beam evaporation, or the like and a step of patterning using a photolithography technique. In these steps, the lower electrode 4 mainly including a metallic material such as Mo, Pt, Al, Au, Cu, or Ti is continuously formed on the sacrificial layer 2 and the substrate 1 so as to have a strip shape. The surface roughness of the lower electrode 4 is preferably about 2 nm or less.

Figure 1F:
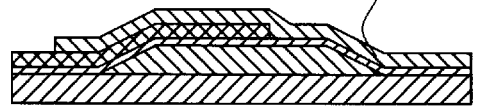

FIG. 1F shows an example of a state in which a piezoelectric thin-film 5 is provided on the dielectric film 3 including the lower electrode 4. The piezoelectric thin-film 5 including zinc oxide, aluminum nitride, or the like, is provided on the dielectric film 3 having the lower electrode 4 thereon by a step of forming the film by sputtering or the like and a step of patterning using a photolithography technique. When an aluminum nitride film is provided, the patterning is performed by wet etching with an alkaline solution.

Figure 1G:

FIG. 1G shows an example of an intermediate product in which an upper electrode 6 is provided on the piezoelectric thin-film 5 formed in the previous step. The upper electrode 6 is formed on the piezoelectric thin-film 5 by the same method as that in the lower electrode 4. In order to improve the overall strength, a second dielectric film is further formed thereon in some cases.

Figure 1H:
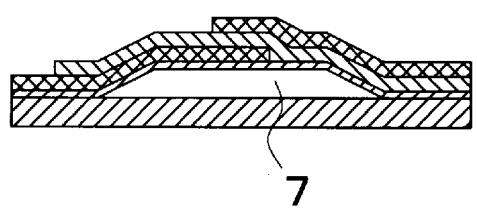

FIG. 1H shows an example of a state in which the sacrificial layer 2 is removed to form the air-gap layer 7. A photoresist film is patterned by photolithography to form an etch hole used for removing the sacrificial layer 2. This photoresist film also functions as a protective film for protecting the upper electrode 6. After the etch hole is formed, a portion of the dielectric film 3 on the sacrificial layer 2 is removed by reactive ion etching, wet etching, or the like. For example, when silicon oxide is used for the dielectric film 3, a reactive ion etching is performed using a fluorine-containing gas such as $CF_4$. Alternatively, a wet etching may be performed with a solution such as hydrofluoric acid. After the etching, the etch mask such as the photoresist is removed with an organic solvent such as acetone. Alternatively, a dry etching using an oxygen etching may be performed.

Finally, the sacrificial layer 2 is etched to form the air-gap layer 7. A photoresist or the like is patterned by photolithography and the sacrificial layer 2 is then removed by reactive ion etching, wet etching, or the like. For example, when zinc oxide is used for the sacrificial layer 2, the zinc oxide is removed with an acidic solution such as hydrochloric acid or phosphoric acid. After the etching, the etch mask such as the photoresist is removed with an organic solvent such as acetone. When a solution that does not etch any of the piezoelectric thin-film 5, the dielectric film 3, the lower electrode 4, and the upper electrode 6 is used, the steps of patterning by photolithography and removing the etch mask can be eliminated. For example, when zinc oxide is used for the sacrificial layer 2, aluminum nitride is used for the piezoelectric thin-film 5, silicon oxide is used for the dielectric film 3, and Pt, Au, Ti, or the like is used for the lower electrode 4 and the upper electrode 6, the sacrificial layer 2 can be easily removed with, for example, a mixed solution of acetic acid and phosphoric acid without patterning. After the etching, the etchant and the like are sufficiently replaced by a volatile liquid such as isopropyl alcohol and drying is then performed. Thus, the air-gap layer 7 is formed.

While preferred embodiments of the present invention have been described above, it is to be understood that variations and modifications will be apparent to those skilled in the art without departing the scope and spirit of the invention. The scope of the present invention, therefore, is to be determined solely by the following claims.

What is claimed is:

1. A method for producing a piezoelectric thin-film resonator comprising the steps of:
   forming on a substrate a sacrificial layer having a top principal surface and end surface portions;
   performing a plasma treatment on the sacrificial layer so as to planarize the sacrificial layer and reduce a surface roughness of the end surface portions and the top principal surface of the sacrificial layer to 5 nm or less;
   forming a strip-shaped dielectric film so as to be continuously disposed on a surface of the substrate, the end surface portions, and the top principal surface of the sacrificial layer;
   forming a lower electrode on the dielectric film;
   forming a piezoelectric thin-film on the dielectric film on which the lower electrode has been formed;
   forming an upper electrode on the piezoelectric thin-film such that a portion of the upper electrode and a portion of the lower electrode face each other on an upper surface of the sacrificial layer with the piezoelectric thin-film disposed therebetween; and
   removing the sacrificial layer to form an air-gap between the substrate and the dielectric film.

2. The method for producing a piezoelectric thin-film resonator according to claim 1, wherein the sacrificial layer comprises a crystalline compound.

3. The method for producing a piezoelectric thin-film resonator according to claim 2, wherein the sacrificial layer comprises zinc oxide.

4. The method for producing a piezoelectric thin-film resonator according to claim 1, wherein the sacrificial layer comprises an organic polymer.

5. The method for producing a piezoelectric thin-film resonator according to claim 1, wherein the sacrificial layer comprises Ge, Sb, Ti, Al, or Cu.

6. The method for producing a piezoelectric thin-film resonator according to claim 1, wherein the plasma treatment includes performing an RF discharge with an inert gas and the sacrificial layer is sputter-etched by the self bias.

7. The method for producing a piezoelectric thin-film resonator according to claim 1, wherein a gas containing an element of the sacrificial layer is used as a gas for the plasma treatment.

8. The method for producing a piezoelectric thin-film resonator according to claim 7, wherein an oxide is used for the sacrificial layer and oxygen is used as the gas for the plasma treatment.

9. The method for producing a piezoelectric thin-film resonator according to claim 1, wherein the end surface portions of the sacrificial layer have a substantially tapered shape forming an angle of about 15 degrees with respect to the surface of the substrate.

* * * * *